US012720857B2

(12) United States Patent
Mochizuki et al.

(10) Patent No.: US 12,720,857 B2
(45) Date of Patent: Aug. 25, 2026

(54) STRUCTURE AND METHOD TO FORM A STACK FIELD EFFECT TRANSISTOR WITH DIFFERENT CHANNEL ORIENTED GATE-ALL-AROUND DEVICES

(71) Applicant: International Business Machines Corporation, Armonk, NY (US)

(72) Inventors: Shogo Mochizuki, Mechanicville, NY (US); Gen Tsutsui, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 740 days.

(21) Appl. No.: 18/067,029

(22) Filed: Dec. 16, 2022

(65) Prior Publication Data

US 2024/0203991 A1 Jun. 20, 2024

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10D 88/00*** | (2026.01) |
| ***H10P 14/20*** | (2026.01) |
| ***H10W 20/20*** | (2026.01) |

(52) U.S. Cl.

CPC ......... *H10D 84/856* (2025.01); *H10D 30/014* (2025.01); *H10D 30/43* (2025.01); *H10D 30/6735* (2025.01); *H10D 62/121* (2025.01); *H10D 62/122* (2025.01); *H10D 64/017* (2025.01); *H10D 84/0167* (2025.01); *H10D 84/0186* (2025.01); *H10D 84/038* (2025.01); *H10D 84/85* (2025.01); *H10D 88/01* (2025.01); *H10P 14/3411* (2026.01); *H10P 14/3462* (2026.01); *H10W 20/20* (2026.01)

(58) Field of Classification Search

CPC .. H10D 30/6735; H10D 30/014; H10D 30/43; H10D 62/121; H10D 62/122; H10D 84/856; H01L 21/02603

See application file for complete search history.

(56) References Cited

U.S. PATENT DOCUMENTS

| | | | | |
|---|---|---|---|---|
| 10,164,121 | B2 | 12/2018 | Hatcher et al. | |
| 10,332,803 | B1 * | 6/2019 | Xie | H10D 84/853 |
| 10,347,657 | B1 | 7/2019 | Leobandung | |

(Continued)

FOREIGN PATENT DOCUMENTS

| | | |
|---|---|---|
| CN | 113206090 A | 8/2021 |

*Primary Examiner* — Davienne N Monbleau
*Assistant Examiner* — Heim Kirin Grewal
(74) *Attorney, Agent, or Firm* — CANTOR COLBURN LLP; Samuel Waldbaum

(57) ABSTRACT

A semiconductor device is provided. The semiconductor device includes a stacked field effect transistor (FET) structure. The stacked FET structure includes a bottom FET device and a top FET device. The bottom FET device has a vertically stacked gate-all-around (GAA) nanosheet (NS) structure and a first channel orientation. The top FET device is isolated from the bottom device and has a horizontally stacked structure and a second channel orientation differing from the first channel orientation.

12 Claims, 5 Drawing Sheets

(56) References Cited

U.S. PATENT DOCUMENTS

| | | | |
|---|---|---|---|
| 10,879,352 | B2 | 12/2020 | Zhang et al. |
| 11,139,402 | B2 | 10/2021 | Moroz et al. |
| 11,177,258 | B2 | 11/2021 | Xie et al. |
| 11,282,838 | B2 | 3/2022 | Zhang et al. |
| 2019/0172755 | A1* | 6/2019 | Smith ................. H01L 21/3065 |
| 2019/0326395 | A1 | 10/2019 | Ando et al. |
| 2022/0013521 | A1* | 1/2022 | Zhang .................. H10D 84/856 |
| 2022/0059414 | A1* | 2/2022 | Yang .................. H10D 30/6735 |
| 2022/0122975 | A1 | 4/2022 | Ryu et al. |
| 2023/0378259 | A1* | 11/2023 | Xie .................... H10D 84/0149 |

* cited by examiner 301
330
340
360
380
350
321
322
320
311
312
310
401
501
510
601

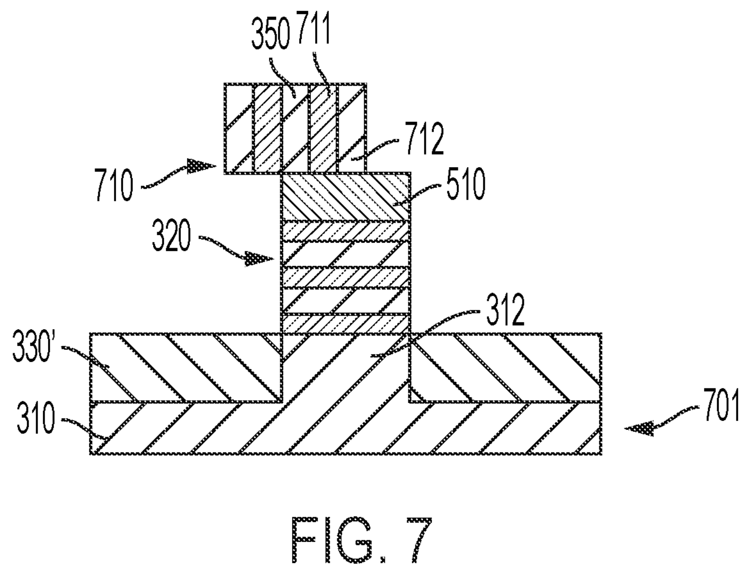
FIG. 7
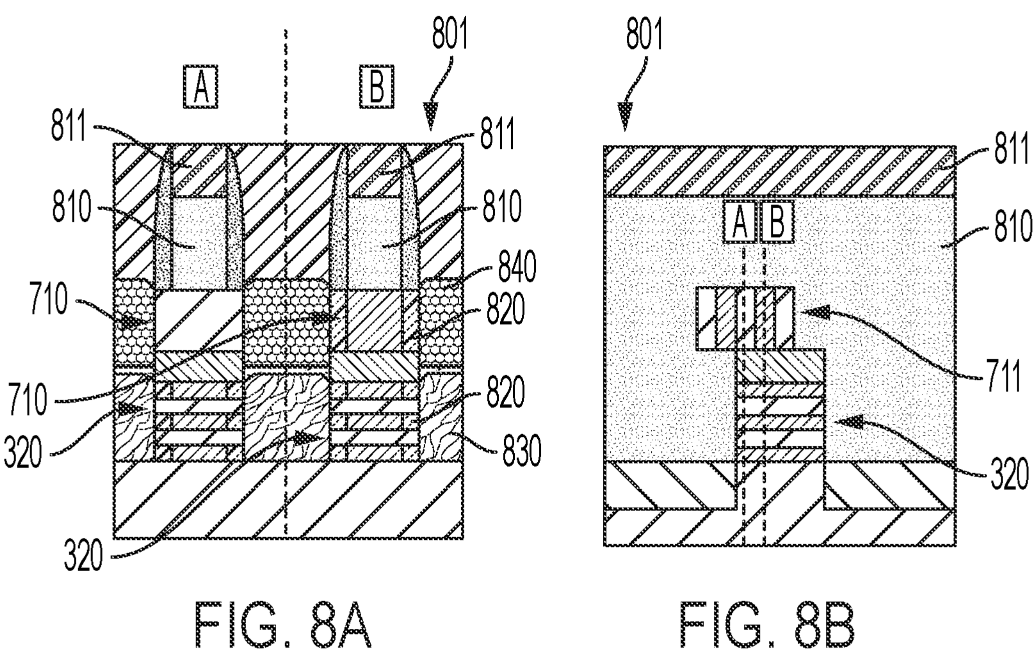
FIG. 8A
FIG. 8B

STRUCTURE AND METHOD TO FORM A STACK FIELD EFFECT TRANSISTOR WITH DIFFERENT CHANNEL ORIENTED GATE-ALL-AROUND DEVICES

BACKGROUND

The present invention generally relates to fabrication methods and resulting structures for semiconductor devices. More specifically, the present invention relates to a semiconductor device fabrication method to form a stack field effect transistor (FET) with different channel oriented gate-all-around (GAA) devices.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

SUMMARY

Embodiments of the invention are directed to a semiconductor device. A non-limiting example of the semiconductor device includes a stacked field effect transistor (FET) structure. The stacked FET structure includes a bottom FET device and a top FET device. The bottom FET device has a vertically stacked gate-all-around (GAA) nanosheet (NS) structure and a first channel orientation. The top FET device is isolated from the bottom device and has a horizontally stacked structure and a second channel orientation differing from the first channel orientation.

Embodiments of the present invention are directed to a semiconductor device. A non-limiting example of the semiconductor device includes a semiconductor substrate. The semiconductor substrate includes an uppermost surface and a vertical fin extending upwardly from the uppermost surface. The semiconductor device further includes shallow trench isolation (STI) aside the vertical fin, a vertically stacked gate-all-around (GAA) nanosheet (NS) field effect transistor (FET) structure disposed on the vertical fin, a dielectric layer disposed on the vertically stacked GAA NS FET structure, a horizontally stacked GAA NS FET structure disposed on a portion of the dielectric layer and high-k metal gate material surrounding the vertically stacked GAA NS FET structure and the horizontally stacked GAA NS FET structure.

Embodiments of the present invention are directed to a semiconductor device fabrication method. A non-limiting example of the semiconductor device fabrication method includes epitaxially growing a sacrificial semiconductor channel region on a bottom device that includes a vertically stacked horizontal fin structure having sacrificial layers between inter-layer dielectric (ILD). The semiconductor device fabrication method further includes patterning the sacrificial semiconductor channel region to a vertical fin structure, disposing a dielectric layer between the vertical fin structure and the vertically stacked horizontal fin structure, recessing the ILD to reveal the vertical fin structure, epitaxially growing vertical sacrificial layers and semiconductor layers horizontally on the vertical fin structure to form a horizontally stacked vertical fin structure, execution of dummy gate, inner spacer and source/drain (S/D) formation and removing the sacrificial layers from the vertically stacked horizontal fin structure and from the horizontally stacked vertical fin structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 7 is a side view of a fifth intermediate structure of a semiconductor device following vertical sacrificial layer growth and hard mask removal applied to the fourth intermediate structure of FIG. 6 in accordance with one or more embodiments of the present invention;

FIGS. 8A and 8B are orthogonal side of a sixth intermediate structure of a semiconductor device following dummy gate formation, inner spacer formation and source/drain (S/D) epitaxial growth applied to the fifth intermediate structure of FIG. 7 in accordance with one or more embodiments of the present invention;

Figure 1:
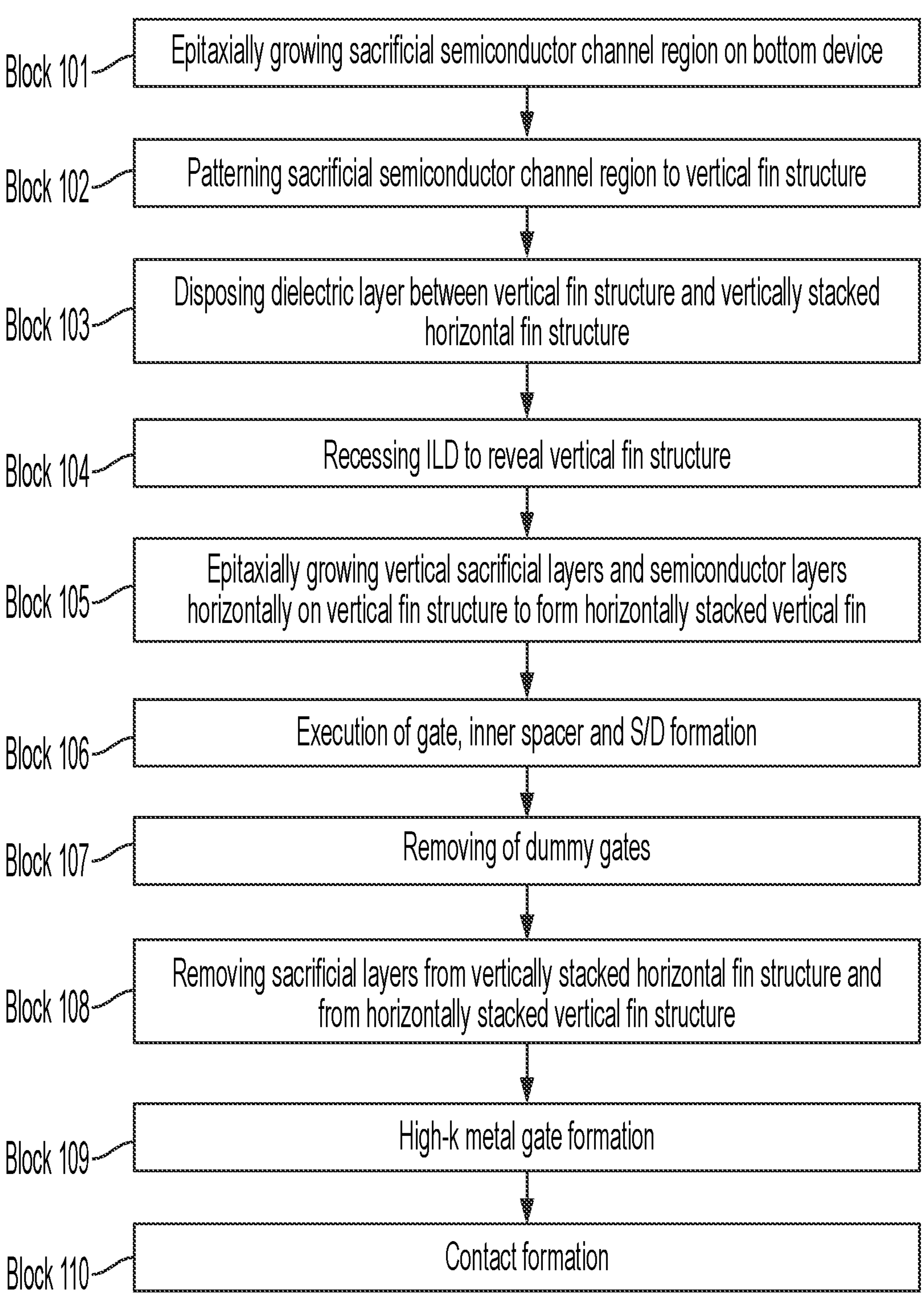
FIG. 1 is a flow diagram illustrating a method of semiconductor device fabrication in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a field effect transistor (FET) typically has a source, a channel and a drain where current flows from the source to the drain as well as a gate that controls the flow of current through the device channel. FETs can have a variety of different structures. For example, FETs have been fabricated with the source, channel and drain formed in a substrate material itself, where the current flows horizontally (i.e., in the plane of the substrate). As another example, FinFETs have been formed with the channel extending outwardly from the substrate, but where the current also flows horizontally from the source to the drain. The channel for the FinFET can be an upright slab of thin rectangular silicon (Si), commonly referred to as the fin with a gate on the fin, as compared to a metal-oxide-semiconductor FET (MOSFET) with a single gate parallel with the plane of the substrate. Depending on doping of the source and drain, an n-doped FET (nFET) or a p-doped FET (pFET) can be formed. Two FETs also can be coupled to form a complementary metal-oxide-semiconductor (CMOS) device, where a p-channel MOSFET and n-channel MOSFET are coupled together.

In certain logic circuits in which FETs are employed, it is often the case that a finFET (pFET) needs to be built onto a nanosheet FET (nFET) to achieve a desired stack structure in which there is expected mobility improvement on the fin channel with orientation (110) for the pFET. Previously, building this desired stack structure required a 60 nm fin height to match Weff with the bottom nanosheet FET and thus resulted in a tall gate structure. Such a tall gate structure can cause difficulties in integration processing.

A need therefore remains for a finFET (pFET) to be built onto a nanosheet (NS) FET (nFET) to achieve a desired stack structure.

Turning now to an overview of the aspects of the invention, one or more embodiments of the invention address the above-described shortcomings of the prior art by providing a method of semiconductor device fabrication. The method includes epitaxial growth of a sacrificial SiGe/Si channel region, patterning of an epitaxial stack to a fin/NS structure, dielectric isolation formation between top and bottom devices, a fin reveal, epitaxial growth of vertical sacrificial SiGe and Si layers on the fins, gate and inner spacer and source/drain (S/D) formation and sacrificial SiGe layer removal post dummy gate pull.

The above-described aspects of the invention address the shortcomings of the prior art by providing for a semiconductor device that is provided as a stacked FET with a horizontally stacked GAA (GAA not strictly required) as the top device and a vertically stacked GAA NS as the bottom device.

Turning now to a more detailed description of aspects of the present invention, FIG. 1 depicts a method of semiconductor device fabrication 100 according to one or more embodiments of the present invention.

As shown in FIG. 1, the method of semiconductor device fabrication 100 includes epitaxially growing a sacrificial semiconductor channel region on a bottom device (block 101), where the bottom device includes a vertically stacked horizontal fin structure having sacrificial layers between inter-layer dielectric (ILD). The method of semiconductor device fabrication 100 further includes patterning the sacrificial semiconductor channel region to a vertical fin structure (block 102), disposing a dielectric layer between the vertical fin structure and the vertically stacked horizontal fin structure (block 103), recessing the ILD to reveal the vertical fin structure (block 104) and epitaxially growing vertical sacrificial layers and semiconductor layers horizontally on the vertical fin structure to form a horizontally stacked vertical fin structure (block 105) that is offset from the vertically stacked horizontal fin structure. The method of semiconductor device fabrication 100 also includes execution of dummy gate, inner spacer and source/drain (S/D) formation (block 106), removing of dummy gates (block 107) and removing the sacrificial layers from the vertically stacked horizontal fin structure and from the horizontally stacked vertical fin structure (block 108). In addition, the method of semiconductor device fabrication 100 includes high-k metal gate formation around the vertically stacked horizontal fin structure and the horizontally stacked vertical fin structure (block 109) and contact formation to form contacts for the vertically stacked horizontal fin structure and the horizontally stacked vertical fin structure (block 110).

In accordance with one or more embodiments of the present invention, the sacrificial semiconductor channel region includes interleaved silicon germanium and silicon layers and the sacrificial layers of the vertically stacked horizontal fin structure and the horizontally stacked vertical fin structure include silicon germanium.

With reference to FIGS. 2-10, the method of semiconductor device fabrication 100 of FIG. 1 will now be described in greater detail.

Figure 2:
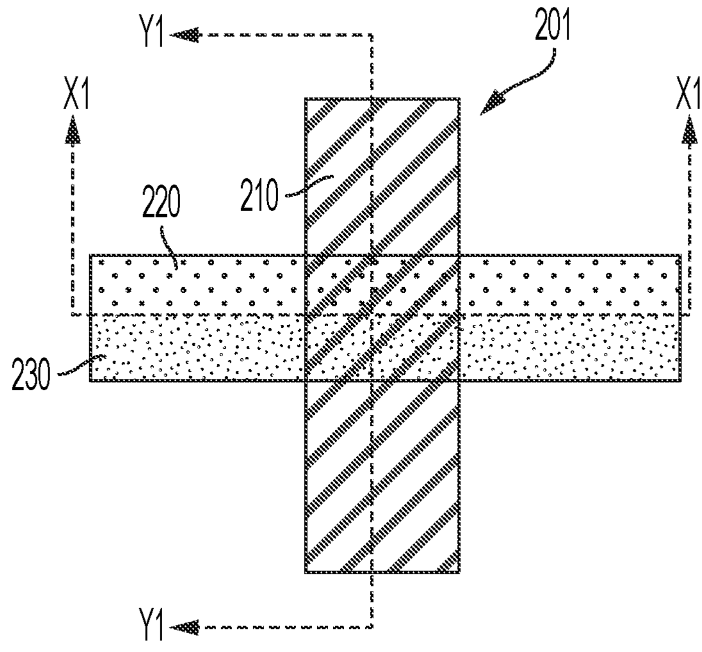
FIG. 2 depicts a top-down view of a semiconductor device according to one or more embodiments of the present invention.
Figures 9A, 9B:
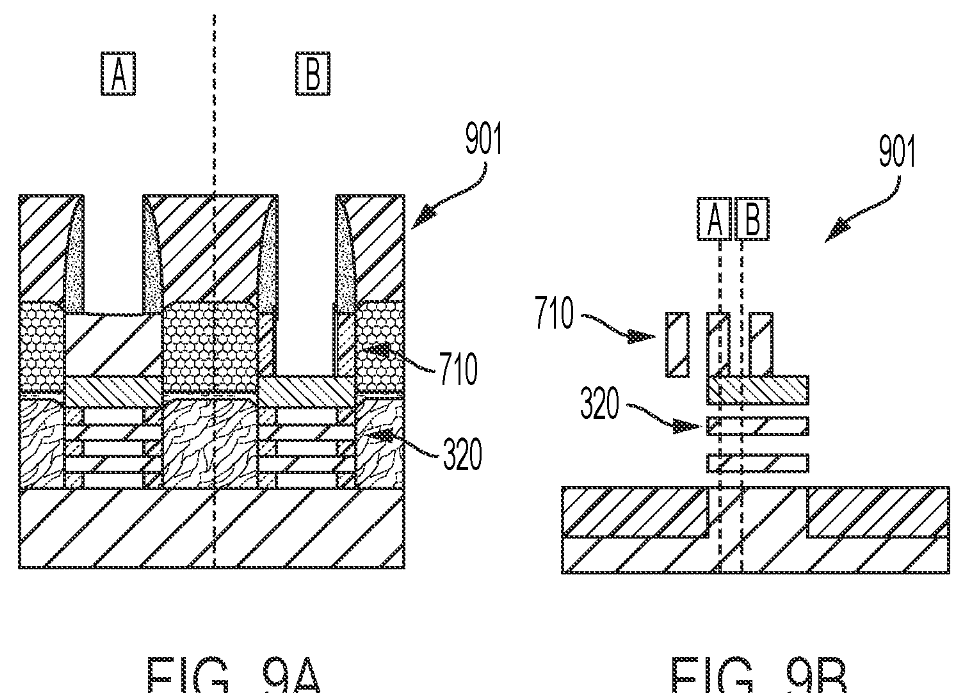
FIGS. 9A and 9B are orthogonal side views of a seventh intermediate structure of a semiconductor device following dummy gate and sacrificial layer removal applied to the sixth intermediate structure of FIGS. 8A and 8B in accordance with one or more embodiments of the present invention.
Figures 10A, 10B:
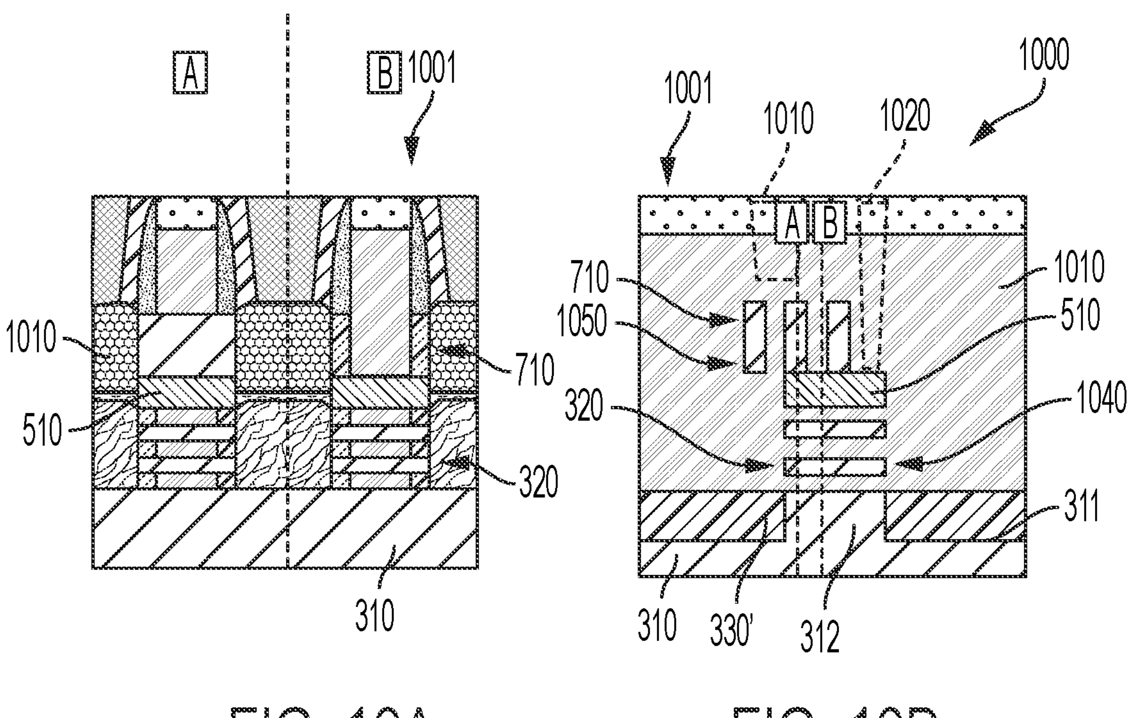
FIGS. 10A and 10B are orthogonal side views of a final structure of a semiconductor device following high-k metal gate formation and contact formation applied to the seventh intermediate structure of FIGS. 9A and 9B in accordance with one or more embodiments of the present invention.

FIG. 2 depicts a top-down view of semiconductor device 201 being fabricated and illustrates that the semiconductor device 201 will eventually include a bottom device 210, a top device 220 and a gate structure 230. FIGS. 3-7 are cross-sectional views of varying stages of semiconductor device fabrication which correspond to line Y1-Y1 of FIG. 2. FIGS. 8A, 9A and 10A are cross-sectional views of varying stages of semiconductor device fabrication which correspond to line X1-X1 of FIG. 2 and FIGS. 8B, 9B and 10B are cross-sectional views of varying stages of semiconductor device fabrication which correspond to line Y1-Y1 of FIG. 2.

Figures 3, 4, 5, 6:
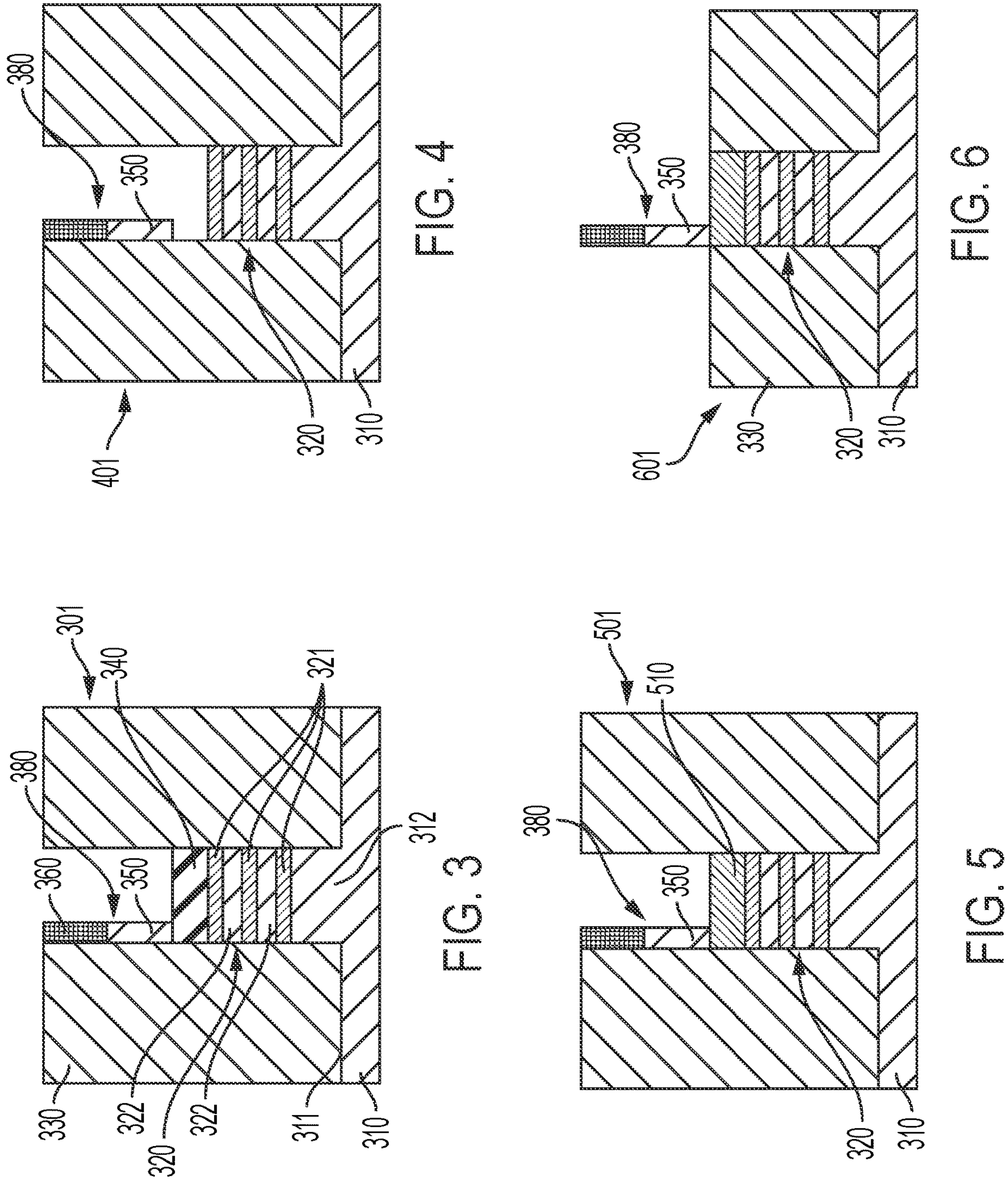
FIG. 3 is a side view of an initial structure of a semiconductor device in accordance with one or more embodiments of the present invention.
FIG. 4 is a side view of a first intermediate structure of a semiconductor device following sacrificial layer removal applied to the initial structure of FIG. 3 in accordance with one or more embodiments of the present invention.
FIG. 5 is a side view of a third intermediate structure of a semiconductor device following dielectric isolation formation applied to the first intermediate structure of FIG. 4 in accordance with one or more embodiments of the present invention.
FIG. 6 is a side view of a fourth intermediate structure of a semiconductor device following inter-layer dielectric (ILD) removal to reveal fin applied to the third intermediate structure of FIG. 5 in accordance with one or more embodiments of the present invention.

As shown in FIG. 3, an initial structure 301 of a semiconductor device is provided in accordance with one or more embodiments of the present invention. The initial structure 301 includes a semiconductor substrate 310. The semiconductor substrate 310 includes an uppermost surface 311 and a vertical fin 312 extending vertically upwardly from the uppermost surface 311. The initial structure 301 further includes a vertically stacked horizontal fin structure 320 and ILD 330 aside the vertical fin 312 and the vertically stacked horizontal fin structure 320. The vertically stacked horizontal fin structure 320 has interleaved sacrificial layers 321, such as silicon germanium layers, and semiconductor layers 322, such as silicon layers. The initial structure 301 also includes a sacrificial layer 340, which is formed of silicon germanium (i.e., high Ge % SiGe), a semiconductor layer 350, which is formed of silicon, and a hard mask 360. The semiconductor layer 350 and the hard mask 360 are patterned to form a vertical fin structure 380.

As shown in FIG. 4, a first intermediate structure 401 of a semiconductor device is provided in accordance with one or more embodiments of the present invention and results from removal of the sacrificial layer 340 (see FIG. 3) of the initial structure 301 of FIG. 3.

As shown in FIG. 5, a third intermediate structure 501 of a semiconductor device is provided in accordance with one or more embodiments of the present invention and results from dielectric isolation formation applied to the first intermediate structure 401 of FIG. 4. This dielectric isolation formation results in the formation of a dielectric layer 510 between an uppermost surface of the vertically stacked horizontal fin structure 320 and a lowermost surface of the semiconductor layer 350 of the vertical fin structure 380.

As shown in FIG. 6, a fourth intermediate structure 601 of a semiconductor device is provided in accordance with one or more embodiments of the present invention and results from recession of the ILD 330 to reveal the vertical fin structure 380 applied to the third intermediate structure 501 of FIG. 5.

As shown in FIG. 7, a fifth intermediate structure 701 of a semiconductor device is provided in accordance with one or more embodiments of the present invention and results from vertical sacrificial layer growth, hard mask removal and ILD recession applied to the fourth intermediate structure 601 of FIG. 6. The vertical sacrificial layer growth is anchored on the semiconductor layer 350 and results in the formation of a horizontally stacked vertical fin structure 710 that has interleaved sacrificial layers 711, such as silicon germanium layers, and semiconductor layers 712, such as silicon layers. The ILD recession effectively results in a reformation of the ILD 330 into shallow trench isolation (STI) 330' due to its being reduced in height such that an uppermost surface thereof is coplanar with the uppermost surface of the vertical fin 312.

As shown in FIGS. 8A and 8B, a sixth intermediate structure 801 of a semiconductor device is provided in accordance with one or more embodiments of the present invention and results from dummy gate formation and S/D recession, inner spacer formation and S/D epitaxial growth applied to the fifth intermediate structure 701 of FIG. 7. The dummy gate formation forms dummy gate material 810 and spacer material 811 around the vertically stacked horizontal fin structure 320, the dielectric layer 510 and the horizontally stacked vertical fin structure 710. The S/D recession forms openings on either side of the FET regions A and B (see FIG. 8A). The inner spacer formation forms inner spacers 820 at exposed sides of sacrificial layers 321, 711. The S/D epitaxial growth forms bottom device S/D epitaxy 830 for the vertically stacked horizontal fin structure 320 and top device S/D epitaxy 840 for the horizontally stacked vertical fin structure 710.

As shown in FIGS. 9A and 9B, a seventh intermediate structure 901 of a semiconductor device is provided in accordance with one or more embodiments of the present invention. The seventh intermediate structure 901 results from removal of the dummy gate material 810 (see FIG. 8) and subsequent removal of the sacrificial layers 321, 711 (see FIG. 8) applied to the sixth intermediate structure 801 of FIGS. 8A and 8B. The removal of the sacrificial layers 321, 711 from the vertically stacked horizontal fin structure 320 and from the horizontally stacked vertical fin structure 710 can be referred to as a channel release process.

As shown in FIGS. 10A and 10B, a final structure 1001 of a semiconductor device 1000 is provided in accordance with one or more embodiments of the present invention following high-k metal gate formation and contact formation applied to the seventh intermediate structure 901 of FIGS. 9A and 9B. The high-k metal gate formation results in the formation of high-k metal gate material 1010 in the empty spaces previously occupied by the sacrificial layers 321, 711 (see FIG. 8) in the vertically stacked horizontal fin structure 320 and in the horizontally stacked vertical fin structure 710. The contact formation results in the formation of a first contact 1020 to contact with the vertically stacked horizontal fin structure 320 and a second contact 1030 to contact with the horizontally stacked vertical fin structure 710.

The semiconductor device 1000 thus includes the semiconductor substrate 310, which, in turn, includes the uppermost surface 311 and the vertical fin 312 as well as the STI 330' aside the vertical fin 312. The semiconductor device 1000 further includes the vertically stacked horizontal fin structure 320 provided as a vertically stacked GAA NS FET structure, which has a first channel orientation 1040 and which is disposed on the vertical fin 312, the dielectric layer 510, the horizontally stacked vertical fin structure 710 provided as a horizontally stacked GAA NS FET structure, which has a second channel orientation 1050 and which is disposed on a portion of the dielectric layer 350 to be partially offset from the vertically stacked GAA NS FET structure. The first channel orientation 1040 and the second channel orientation 1050 differ from one another. The semiconductor device 1000 further includes the high-k metal gate material 1010, the first contact 1020 and the second contact 1030.

In accordance with one or more embodiments of the present invention, the horizontally stacked vertical fin structure 710 provided as the horizontally stacked GAA NS FET structure is characterized in that separation between vertical nanosheets is defined by the vertical epitaxial growth resulting in the fifth intermediate structure 701 of FIG. 7. Also, a height of a channel of the horizontally stacked vertical fin structure 710 provided as the horizontally stacked GAA NS FET structure is defined by a template fin height of the semiconductor layer 350 of the vertical fin structure 380 of the third intermediate structure 501 of FIG. 5. In addition, channels of the horizontally stacked vertical fin structure 710 provided as the horizontally stacked GAA NS FET structure can be self-aligned to channels of the vertically stacked horizontal fin structure 320 provided as the vertically stacked GAA NS FET structure. Moreover, numbers of channels of the horizontally stacked vertical fin structure

710 provided as the horizontally stacked GAA NS FET structure can be defined by sacrificial SiGe/Si epitaxy.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a micro-chip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device, comprising:

a stacked field effect transistor (FET) structure comprising bottom and top FET devices and a dielectric layer, the bottom FET device having a vertically stacked gate-all-around (GAA) nanosheet (NS) structure and a first channel orientation, the first channel orientation being characterized in that each NS of the bottom FET device is elongate in a channel direction and a horizontal direction, the top FET device being isolated from the bottom FET device by the dielectric layer, and the top FET device having a horizontally stacked structure and a second channel orientation differing from the first channel orientation, the second channel orientation being characterized in that each NS of the top FET device is elongate in the channel direction and a vertical direction perpendicular to the horizontal direction, wherein each NS of the top FET device comprises a vertically oriented semiconductor layer and the top FET device is partially offset from the bottom FET device such that at least one vertically oriented semiconductor layer of the top FET device extends beyond a vertical plane of a sidewall of the bottom FET device.

2. The semiconductor device according to claim 1, further comprising:

a first contact in contact with the bottom FET device; and a second contact separate from the first contact and in contact with the top FET device.

3. The semiconductor device according to claim 1, wherein the top FET device has a horizontally stacked GAA NS structure with a separation between vertical nanosheets is defined by vertical epitaxial growth.

4. The semiconductor device according to claim 3, wherein a height of a channel of the top FET device is defined by a template fin height.

5. The semiconductor device according to claim 3, wherein channels of the top FET device are self-aligned to the channels of the bottom device.

6. The semiconductor device according to claim 3, wherein a number of channels of the top FET device is defined by sacrificial SiGe/Si epitaxy.

7. A semiconductor device, comprising:

a semiconductor substrate comprising an uppermost surface and a vertical fin extending upwardly from the uppermost surface;

shallow trench isolation (STI) aside the vertical fin;

a vertically stacked gate-all-around (GAA) nanosheet (NS) field effect transistor (FET) structure disposed on the vertical fin and comprising nanosheets (NSs) that are elongate in a channel direction and a horizontal direction;

a dielectric layer disposed on the vertically stacked GAA NS FET structure;

a horizontally stacked GAA NS FET structure disposed on a portion of the dielectric layer to be isolated from the vertically stacked GAA NS FET structure and comprising NSs that are elongate in the channel direction and a vertical direction; and high-k metal gate material surrounding the vertically stacked GAA NS FET structure and the horizontally stacked GAA NS FET structure, wherein each NS of the horizontally stacked GAA NS FET structure comprises a vertically oriented semiconductor layer and the horizontally stacked GAA NS FET structure is partially offset from the vertically stacked GAA NS FET structure such that at least one vertically oriented semiconductor layer of the horizontally stacked GAA NS FET structure extends beyond a vertical plane of a sidewall of the horizontally stacked GAA NS FET structure.

8. The semiconductor device according to claim 7, further comprising:

a first contact in contact with the vertically stacked GAA NS FET structure; and a second contact separate from the first contact and in contact with the horizontally stacked GAA NS FET structure.

9. The semiconductor device according to claim 7, wherein, for the horizontally stacked GAA NS FET structure, a separation between vertical nanosheets is defined by vertical epitaxial growth.

10. The semiconductor device according to claim 8, wherein a height of a channel of the horizontally stacked GAA NS FET structure is defined by a template fin height.

11. The semiconductor device according to claim 8, wherein channels of the horizontally stacked GAA NS FET structure are self-aligned to the channels of the vertically stacked GAA NS FET structure.

12. The semiconductor device according to claim 8, wherein a number of channels of the horizontally stacked GAA NS FET structure is defined by sacrificial SiGe/Si epitaxy.

* * * * *